(12) United States Patent
Kuehn et al.

(10) Patent No.: US 9,984,917 B2
(45) Date of Patent: May 29, 2018

(54) SEMICONDUCTOR DEVICE WITH AN INTERCONNECT AND A METHOD FOR MANUFACTURING THEREOF

(71) Applicant: Infineon Technologies AG, Neubiberg (DE)

(72) Inventors: Christian Kuehn, Munich (DE); Martin Bartels, Dresden (DE); Henning Feick, Dresden (DE); Dirk Offenberg, Dresden (DE); Anton Steltenpohl, Munich (DE); Hans Taddiken, Munich (DE); Ines Uhlig, Dresden (DE)

(73) Assignee: Infineon Technologies AG, Neubiberg (DE)

(*) Notice: Subject to any disclaimer, the term of this patent is extended or adjusted under 35 U.S.C. 154(b) by 0 days. days.

(21) Appl. No.: 14/283,242

(22) Filed: May 21, 2014

(65) Prior Publication Data
US 2015/0340277 A1    Nov. 26, 2015

(51) Int. Cl.
*H01L 21/76*      (2006.01)
*H01L 21/762*     (2006.01)
(Continued)

(52) U.S. Cl.
CPC .... *H01L 21/76237* (2013.01); *H01L 29/0607* (2013.01); *H01L 29/0649* (2013.01);
(Continued)

(58) Field of Classification Search
CPC ......... H01L 21/76243; H01L 21/76264; H01L 21/76237
(Continued)

(56) References Cited

U.S. PATENT DOCUMENTS 4,783,689 A * 11/1988 Nishida ................ H01L 31/105
                                                     257/186
5,874,346 A *  2/1999 Fulford, Jr. et al. .......... 438/433
(Continued)

FOREIGN PATENT DOCUMENTS

CN       1784787 A      6/2006
CN     102751325 A     10/2012
(Continued)

OTHER PUBLICATIONS

H.S.Gamble et al., Low-Loss CPW Lines on Surface Stabilized High-Resistivity Silicon, IEEE Microwave and guided wave letters vol. 9, No. 10, Oct. 1999, pp. 395-397.
(Continued)

*Primary Examiner* — Lex Malsawma
*Assistant Examiner* — Eric W Jones
(74) *Attorney, Agent, or Firm* — Viering, Jentschura & Partner mbB

(57) ABSTRACT

A method for manufacturing a semiconductor device in accordance with various embodiments may include: forming an opening in a first region of a semiconductor substrate, the opening having at least one sidewall and a bottom; implanting dopant atoms into the at least one sidewall and the bottom of the opening; configuring at least a portion of a second region of the semiconductor substrate laterally adjacent to the first region as at least one of an amorphous or polycrystalline region; and forming an interconnect over at least one of the first and second regions of the semiconductor substrate.

25 Claims, 7 Drawing Sheets

(51) Int. Cl.
*H01L 29/06* (2006.01)
*H01L 21/265* (2006.01)

(52) U.S. Cl.
CPC .... *H01L 21/2652* (2013.01); *H01L 21/26506* (2013.01); *H01L 21/26586* (2013.01)

(58) Field of Classification Search
USPC ........ 438/407, 400, 404, 423, 424; 257/499, 257/506, 510
See application file for complete search history.

(56) References Cited

U.S. PATENT DOCUMENTS

| | | | | |
|---|---|---|---|---|
| 6,049,117 | A * | 4/2000 | Fukunaga | H01L 27/1446 257/257 |
| 6,342,429 | B1 * | 1/2002 | Puchner et al. | 438/424 |
| 6,380,603 | B1 * | 4/2002 | Takimoto | H01L 27/144 257/461 |
| 6,395,587 | B1 * | 5/2002 | Crowder | H01L 21/26506 257/E21.335 |
| 7,012,005 | B2 * | 3/2006 | Lichtenberger | H01L 21/2822 257/E21.335 |
| 7,071,069 | B2 * | 7/2006 | Tan | H01L 21/26513 257/E21.336 |
| 8,936,981 | B2 * | 1/2015 | Sun | H01L 27/11563 438/221 |
| 2001/0054712 | A1 * | 12/2001 | Aoki | G01D 5/38 257/72 |
| 2002/0081797 | A1 * | 6/2002 | Brady et al. | 438/217 |
| 2003/0164887 | A1 * | 9/2003 | Koizumi | H04N 5/3577 348/308 |
| 2005/0148147 | A1 * | 7/2005 | Keating | H01L 21/30608 438/299 |
| 2006/0118884 | A1 | 6/2006 | Losehand et al. | |
| 2006/0186505 | A1 * | 8/2006 | Adkisson | H01L 27/14609 257/463 |
| 2007/0187734 | A1 * | 8/2007 | Adkisson | H01L 27/1463 257/293 |
| 2007/0296028 | A1 * | 12/2007 | Brar | H01L 29/47 257/328 |
| 2009/0042359 | A1 * | 2/2009 | Lindsay et al. | 438/433 |
| 2009/0053874 | A1 * | 2/2009 | Dubois | H01L 21/76237 438/433 |
| 2009/0078973 | A1 * | 3/2009 | Hsu | H01L 27/1464 257/292 |
| 2009/0134486 | A1 * | 5/2009 | Fujikata | H01L 31/1085 257/449 |
| 2009/0179280 | A1 * | 7/2009 | Kohli | H01L 21/26506 257/408 |
| 2009/0261327 | A1 * | 10/2009 | Schaefer | H01L 21/02532 257/52 |
| 2010/0044792 | A1 * | 2/2010 | Hebert | H01L 29/0623 257/341 |
| 2010/0090303 | A1 * | 4/2010 | Takizawa | H01L 21/26506 257/432 |
| 2010/0110239 | A1 * | 5/2010 | Ramappa | H01L 27/14603 348/243 |
| 2010/0243026 | A1 * | 9/2010 | Shima | H01L 31/048 136/244 |
| 2013/0178045 | A1 * | 7/2013 | Tan et al. | 438/430 |
| 2013/0181321 | A1 * | 7/2013 | Hurwitz et al. | 257/506 |
| 2013/0241021 | A1 * | 9/2013 | Stenson | H01L 27/14643 257/435 |
| 2014/0232917 | A1 * | 8/2014 | Kawahito | H04N 5/3745 348/303 |
| 2015/0323382 | A1 * | 11/2015 | Valer'evich | G01J 1/44 356/218 |

FOREIGN PATENT DOCUMENTS

WO 2004081989 A2 9/2004
WO 2010091752 A1 8/2010

OTHER PUBLICATIONS

D.Lederer et.al.; New Substrate Passivation Method Dedicated to HR SOI Wafer Fabrication With Increased Substrate Resistivity, IEEE Electron Device Letters vol. 26, No. 11 Nov. 2005, pp. 805-807.
D.Lederer et.al., Performance of SOI devices transferred onto passivated HR SOI substrates using a layer transfer technique, 2006 IEEE International SOI Conference Proceedings, pp. 29-30.

* cited by examiner

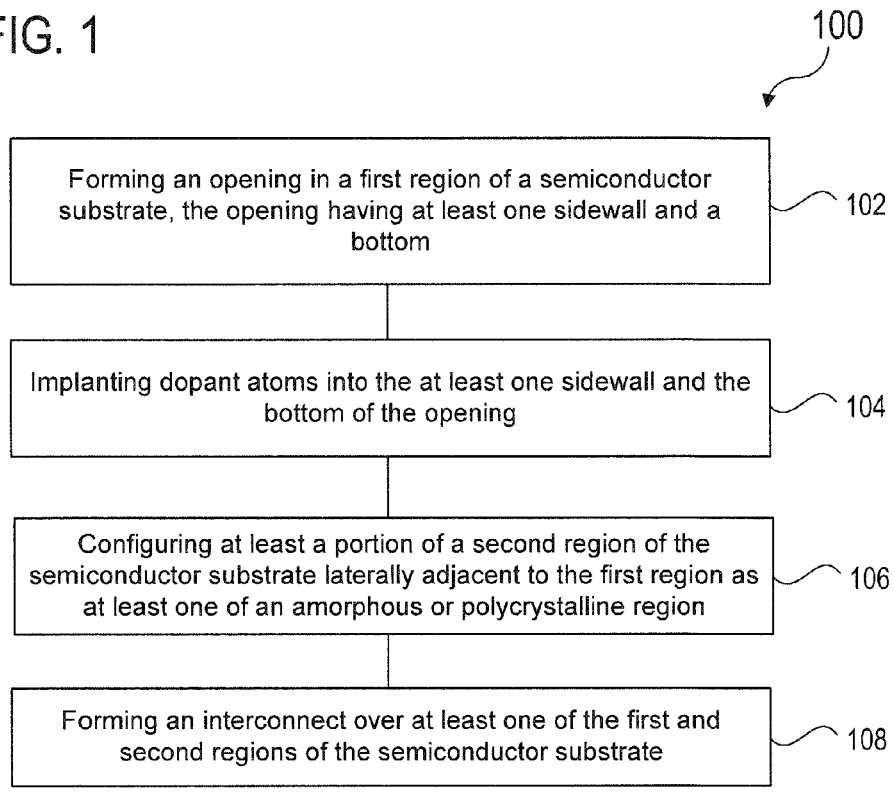
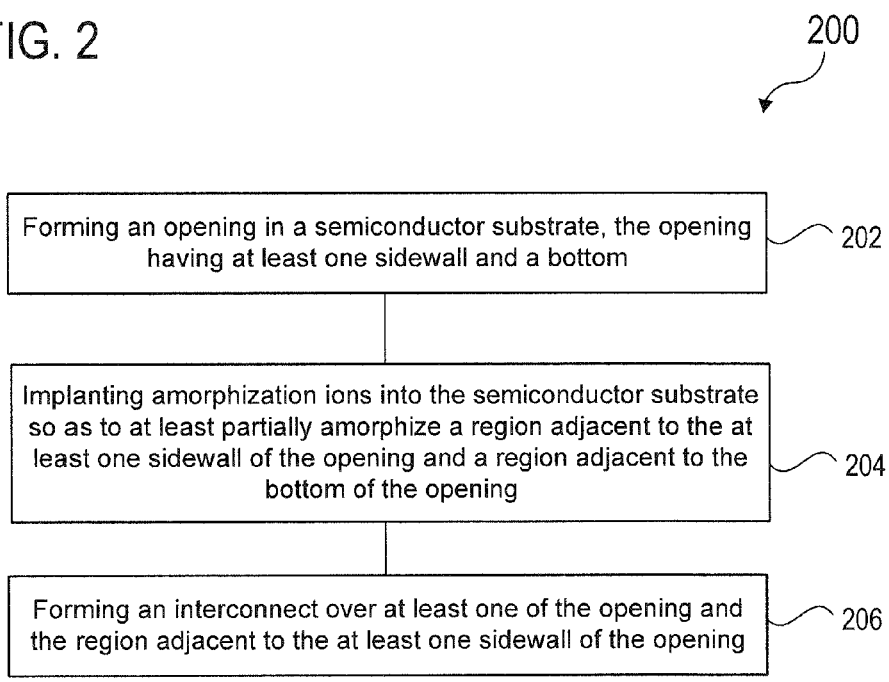

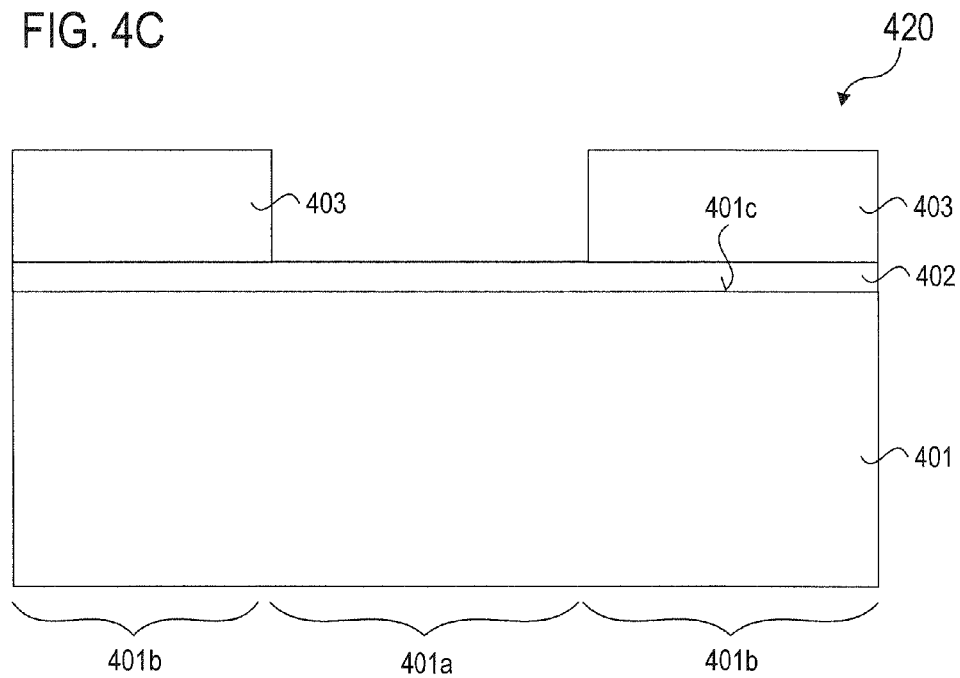
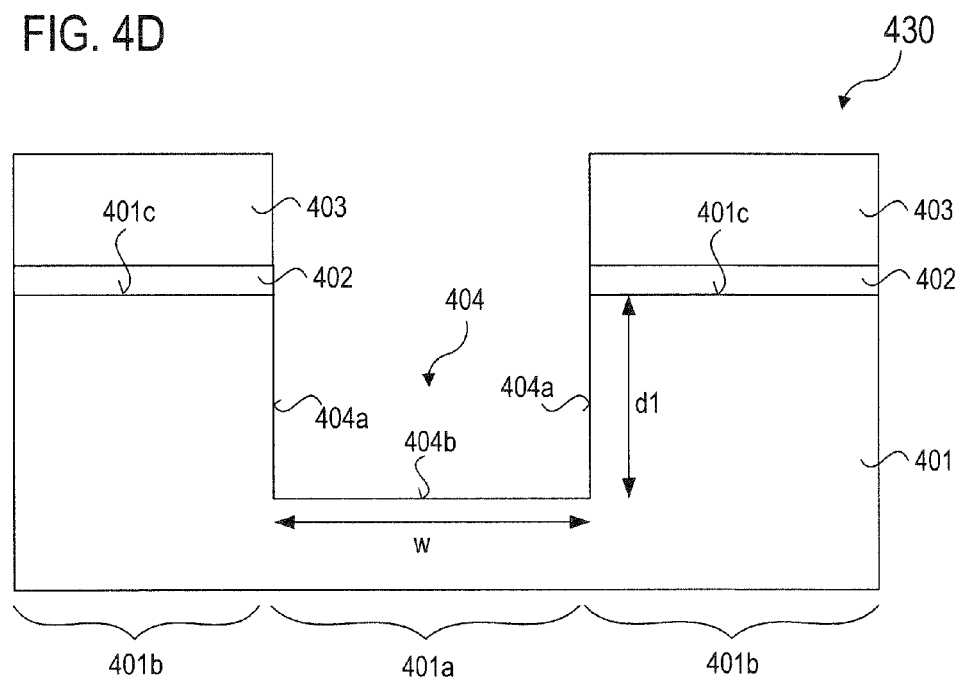

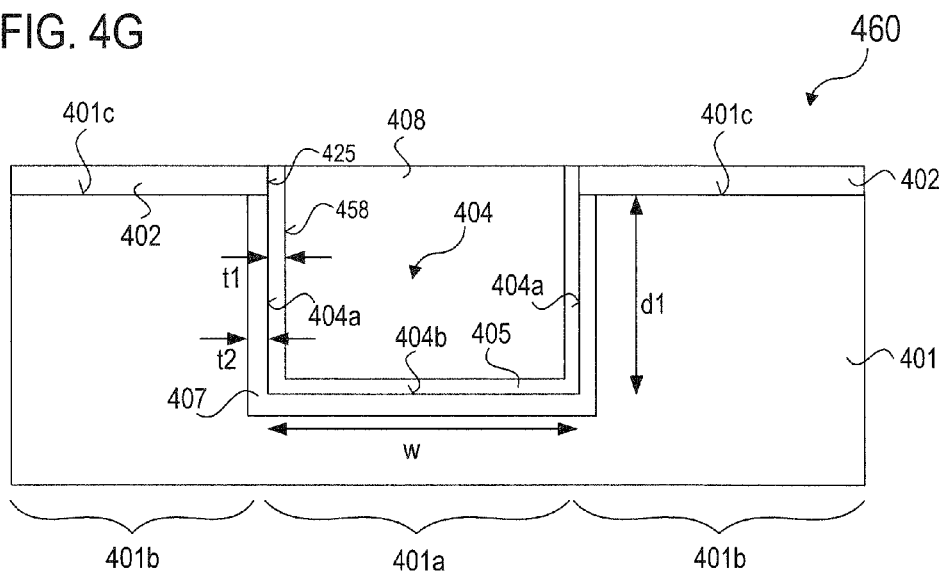
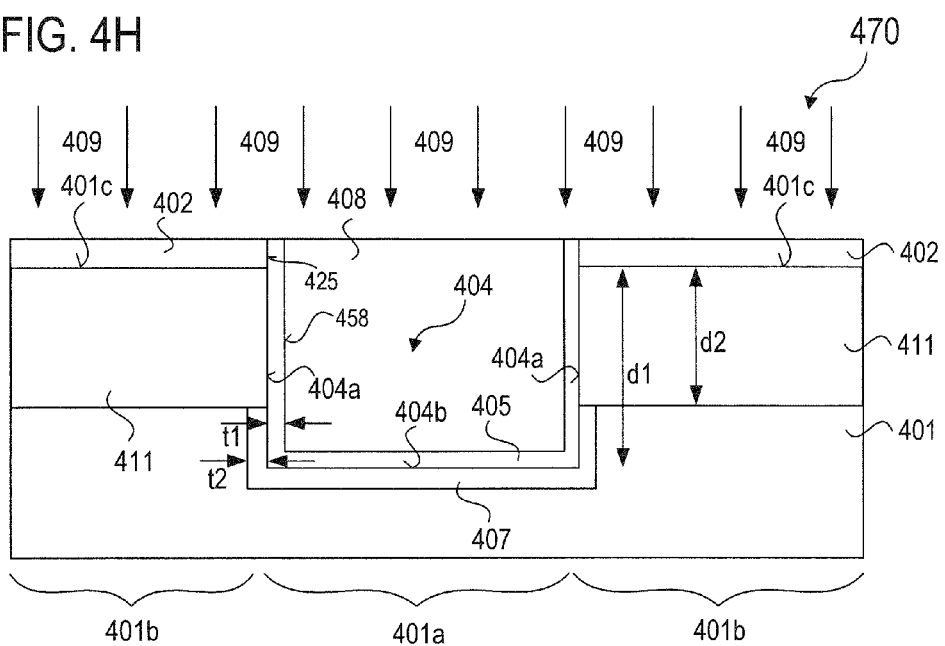

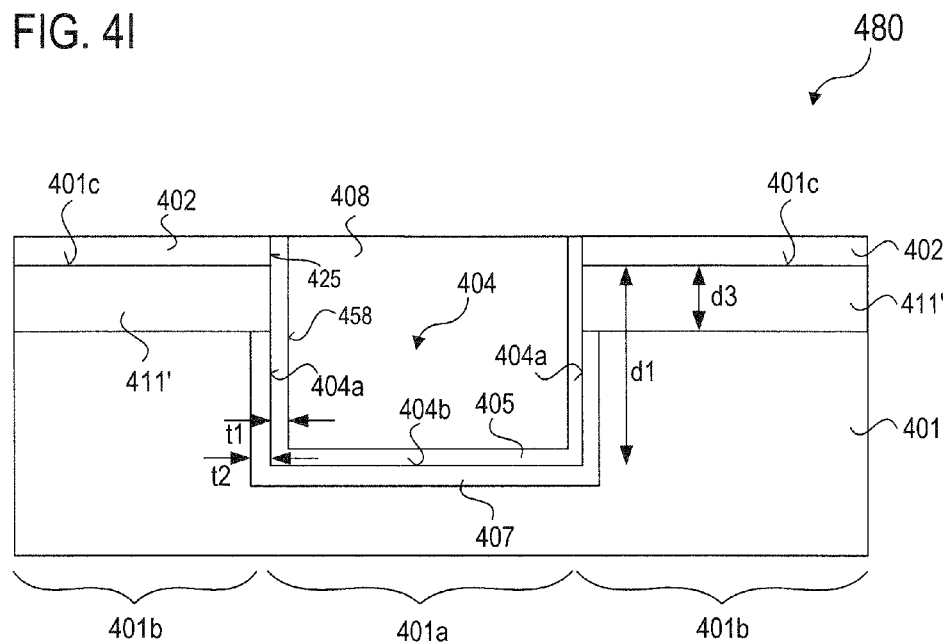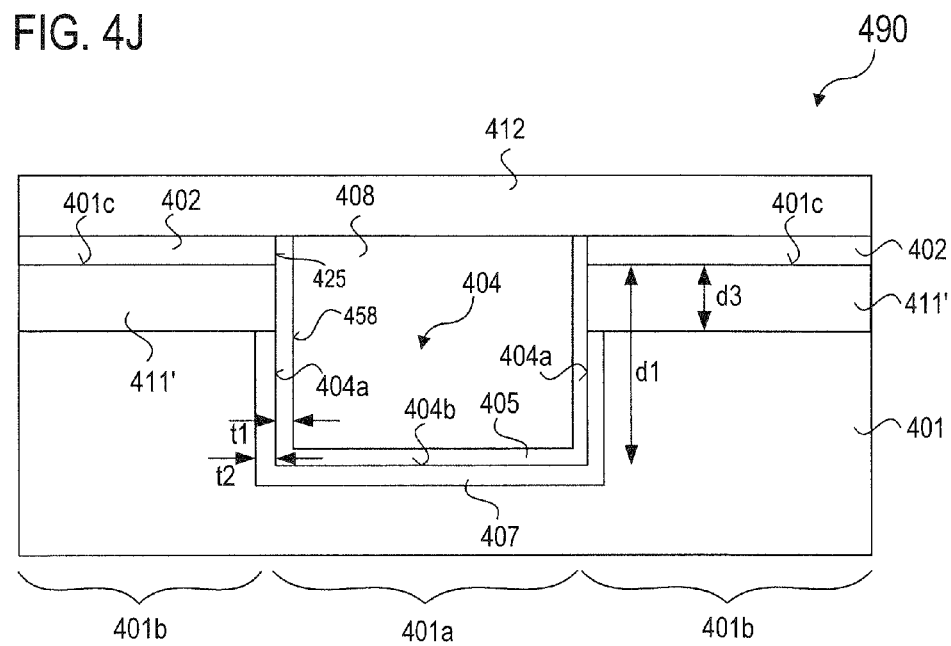

SEMICONDUCTOR DEVICE WITH AN INTERCONNECT AND A METHOD FOR MANUFACTURING THEREOF

TECHNICAL FIELD

Various embodiments relate to a method for manufacturing a semiconductor device and a semiconductor device.

BACKGROUND

Semiconductor devices may include interconnects (e.g., metal interconnects) to carry electrical potentials or signals. An interconnect may be disposed over a semiconductor substrate of the semiconductor device, for example with an insulating layer disposed in-between. Under certain operating conditions, a parasitic capacitance may form between the interconnect and the substrate. For certain devices such as, e.g., high-frequency (HF) switches, this parasitic capacitance may be undesirable as it may have a negative impact on signal quality of an electrical signal carried by the interconnect.

Thus, it may be desirable to reduce parasitic capacitances between a semiconductor substrate and an interconnect in a semiconductor device.

SUMMARY

In accordance with various embodiments, a method for manufacturing a semiconductor device may include: forming an opening in a first region of a semiconductor substrate, the opening having at least one sidewall and a bottom; implanting dopant atoms into the at least one sidewall and the bottom of the opening; configuring at least a portion of a second region of the semiconductor substrate laterally adjacent to the first region as at least one of an amorphous or polycrystalline region; and forming an interconnect over at least one of the first and second regions of the semiconductor substrate.

In accordance with various embodiments, a method for manufacturing a semiconductor device may include: forming an opening in a semiconductor substrate, the opening having at least one sidewall and a bottom; implanting amorphization ions into the semiconductor substrate so as to at least partially amorphize a region adjacent to the at least one sidewall of the opening and a region adjacent to the bottom of the opening; and forming an interconnect over at least one of the opening and the region adjacent to the at least one sidewall of the opening.

In accordance with various embodiments, a semiconductor device may include: a semiconductor substrate; an opening disposed in the semiconductor substrate, the opening having at least one sidewall and a bottom; a doped region disposed in the semiconductor substrate adjacent to the at least one sidewall and the bottom of the opening; at least one of an amorphous or polycrystalline region disposed at a surface of the semiconductor substrate adjacent to the at least one sidewall of the opening; and an interconnect disposed over at least one of the opening and the amorphous or polycrystalline region.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1 illustrates a method for manufacturing a semiconductor device in accordance with various embodiments;

FIG. 2 illustrates a method for manufacturing a semiconductor device in accordance with various embodiments;

FIGS. 4A to 4J show various processing stages in a method for manufacturing a semiconductor device in accordance with various embodiments.

DESCRIPTION

Figure 3:
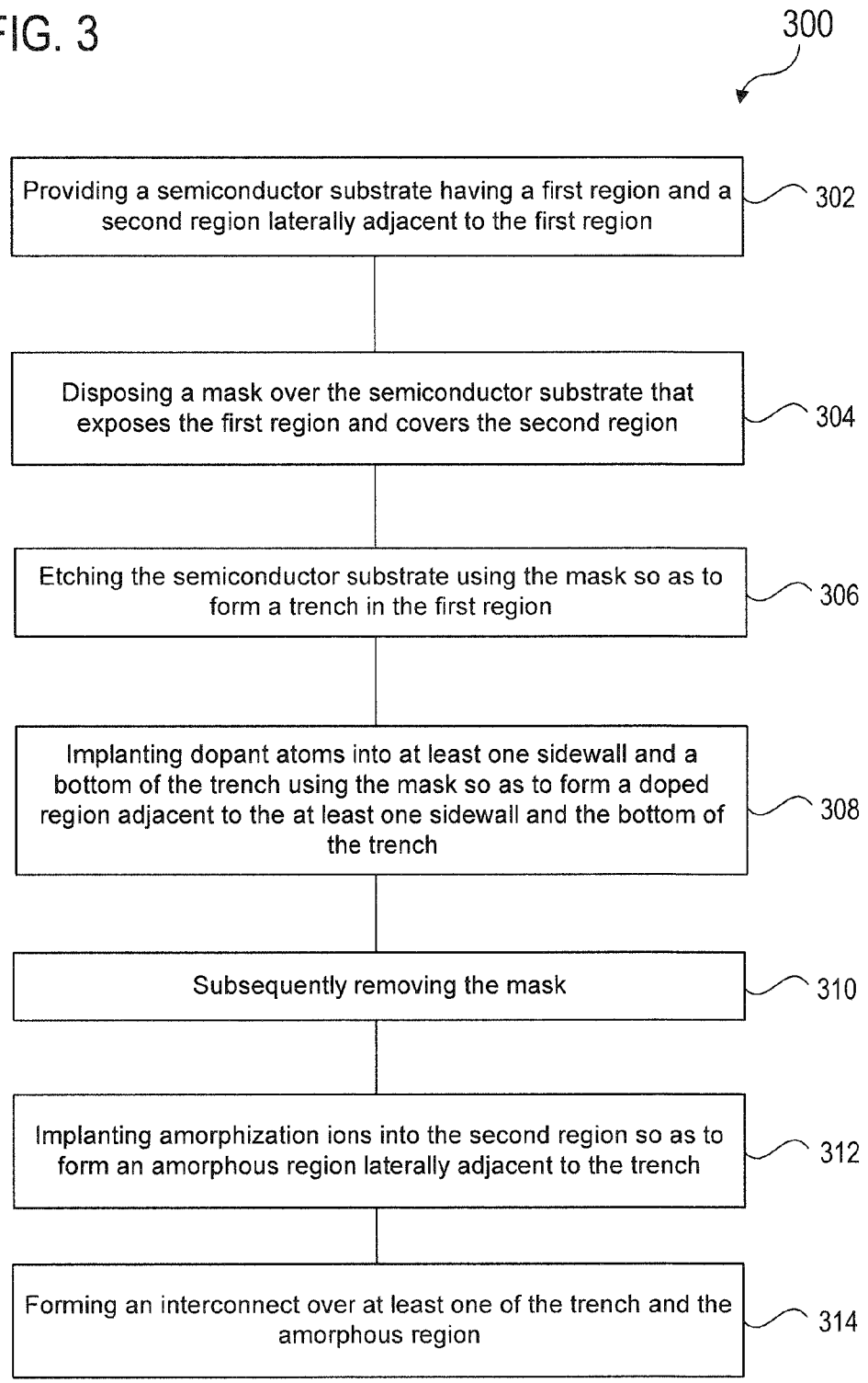
FIG. 3 illustrates a method for manufacturing a semiconductor device in accordance with various embodiments.

The following detailed description refers to the accompanying drawings that show, by way of illustration, specific details and embodiments in which the invention may be practised. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments. Various embodiments are described in connection with methods and various embodiments are described in connection with devices. However, it may be understood that embodiments described in connection with methods may similarly apply to the devices, and vice versa.

The word "exemplary" is used herein to mean "serving as an example, instance, or illustration". Any embodiment or design described herein as "exemplary" is not necessarily to be construed as preferred or advantageous over other embodiments or designs.

The terms "at least one" and "one or more" may be understood to include any integer number greater than or equal to one, i.e. one, two, three, four, . . . , etc.

The term "a plurality" may be understood to include any integer number greater than or equal to two, i.e. two, three, four, five, . . . , etc.

The word "over", used herein to describe forming a feature, e.g. a layer "over" a side or surface, may be used to mean that the feature, e.g. the layer, may be formed "directly on", e.g. in direct contact with, the implied side or surface. The word "over", used herein to describe forming a feature, e.g. a layer "over" a side or surface, may be used to mean that the feature, e.g. the layer, may be formed "indirectly on" the implied side or surface with one or more additional layers being arranged between the implied side or surface and the formed layer.

In like manner, the word "cover", used herein to describe a feature disposed over another, e.g. a layer "covering" a side or surface, may be used to mean that the feature, e.g. the layer, may be disposed over, and in direct contact with, the implied side or surface. The word "cover", used herein to describe a feature disposed over another, e.g. a layer "covering" a side or surface, may be used to mean that the feature, e.g. the layer, may be disposed over, and in indirect contact with, the implied side or surface with one or more additional layers being arranged between the implied side or surface and the covering layer.

The terms "coupling" or "connection" may be understood to include both the case of a direct "coupling" or "connection" and the case of an indirect "coupling" or "connection". The terms "coupling" or "connection" may refer to an electrically conductive "coupling" or "connection". That is, charge carriers, e.g. electrons, may be transported via the "coupling" or "connection".

Various embodiments described herein may, for example, be applied to high-frequency devices, e.g. high-frequency switches, such as, e.g., antenna switches used, for example, in mobile communication devices to switch between various input/output terminals, however various embodiments may be used in other applications as well.

High-frequency switches (e.g., transistors) may be disposed in a high-ohmic substrate (e.g., silicon substrate). They may be connected to one another by means of interconnects, e.g. metal interconnects. In addition, interconnects (e.g., metal interconnects) may run from the switches to terminal areas (e.g., contact pads) of a chip. Thus, a parasitic capacitance (e.g., MOS (metal oxide semiconductor) capacitance) may form between the interconnects and the substrate. Due to a DC voltage between the interconnect and the substrate, which may be required for the functionality of the switch, and, as the case may be, due to the presence of electrical charges (e.g., oxide charges) in a dielectric between the interconnect and the substrate, an accumulation or inversion layer may form at an interface between the substrate (e.g., silicon substrate) and the dielectric (e.g., oxide). For example, an n-conducting inversion layer may form in a commonly used lightly p-doped substrate.

The capacitive coupling of the charge carriers in the inversion layer to the high-frequency signal carried by the interconnect may have a negative impact on the signal. On the one hand, the signal may be damped, on the other hand it may be slightly distorted, i.e. linearity of signal transmission may deteriorate. To make things worse, the surface of the substrate (e.g. silicon substrate) below the interconnects may not be flat but patterned in some technologies.

Various embodiments may suppress or prevent occurrence of an inversion or accumulation layer and may, for example, improve signal transmission.

On flat silicon substrates, improvements have been achieved by a selective counter doping of the surface channel. The term "counter doping" indicates that a conductivity type of this doping is opposite to a conductivity type of an inversion layer that is to be suppressed. For example, in case of an n-conducting inversion layer a p-type counter doping may be applied. On substrates that are patterned with STI (shallow trench isolation) structures, this doping has conventionally been introduced at the beginning of the process in the by then still open STI, and additionally later in the process between the STI areas. The counter doping may imply a relatively high process variance since the substrate doping and charges in a dielectric (e.g., oxide charges) may vary relatively strongly. In addition, overlap areas between the two dopings may be present in the STI patterned substrates, so that a complete compensation of the charges may not be possible everywhere.

In accordance with various embodiments, a counter doping may be introduced via a first implantation into a shallow trench isolation (STI), which is still open then (i.e., not completely filled with insulating material), and, as a second implantation, amorphization ions (e.g., argon ions) may be implanted with a high dose into regions adjacent or between the STI region(s). Thus, an amorphous region may be formed in the substrate, e.g. a region of amorphous silicon. In accordance with other embodiments, the amorphous region may be formed by means of depositing an amorphous layer, e.g. an amorphous silicon layer, over a crystalline region of the substrate. In the amorphous region (e.g., amorphous silicon), electrons may recombine almost immediately with positive charge carriers. Thus, neither an accumulation channel nor an inversion channel may form in the amorphous region (e.g., amorphous silicon). This principle may sometimes be referred to as Fermi level pinning.

Thus, various embodiments may obviate or at least substantially reduce the aforementioned effects (i.e., high process variance and/or incomplete charge compensation).

FIG. 1 shows a method 100 for manufacturing a semiconductor device in accordance with various embodiments.

Method 100 may include: forming an opening in a first region of a semiconductor substrate, the opening having at least one sidewall and a bottom (in 102); implanting dopant atoms into the at least one sidewall and the bottom of the opening (in 104); configuring at least a portion of a second region of the semiconductor substrate laterally adjacent to the first region as at least one of an amorphous or polycrystalline region (in 106); and forming an interconnect over at least one of the first and second regions of the semiconductor substrate (in 108).

In one or more embodiments, the term "laterally" may include or refer to a direction parallel or substantially parallel to a main processing surface of the semiconductor substrate and/or semiconductor device.

In one or more embodiments, the term "dopant atoms" may include or refer to atoms that have a doping effect on the material of the semiconductor substrate. In one or more embodiments, the term "dopant atoms" may include or refer to atoms that are incorporated into the lattice structure of the material of the semiconductor substrate. In one or more embodiments, the term "dopant atoms" may include or refer to atoms that are electrically active in the band structure of the material of the semiconductor substrate. In one or more embodiments, the term "dopant atoms" may include or refer to atoms that form additional energy levels in a band gap of the band structure (e.g., acceptor levels in case of p-type dopants, or donor levels in case of n-type dopants).

In one or more embodiments, the dopant atoms may be p-type dopant atoms.

In one or more embodiments, the dopant atoms may be n-type dopant atoms.

In one or more embodiments, the dopant atoms may be selected from a group of dopant atoms, the group consisting of: indium atoms, boron atoms.

In one or more embodiments, the dopant atoms may be implanted with a dose in the range from about $10^{10}$ cm$^{-2}$ to about $10^{13}$ cm$^{-2}$, however other values of the dose may be possible in accordance with other embodiments.

In one or more embodiments, the dopant atoms may be implanted with an energy in the range from about 5 keV to about 200 keV, however other values of the energy may be possible in accordance with other embodiments.

In one or more embodiments, implanting the dopant atoms into the at least one sidewall and the bottom of the opening may form a doped region adjacent to the at least one sidewall and adjacent to the bottom of the opening.

In one or more embodiments, the doped region may surround the opening in the semiconductor substrate.

In one or more embodiments, the doped region may be of the same conductivity type as the semiconductor substrate.

In one or more embodiments, the doped region may have a higher dopant concentration than the semiconductor substrate.

In one or more embodiments, the dopant concentration in the doped region may be in the range from about $10^{14}$ cm$^{-3}$ to about $10^{18}$ cm$^{-3}$, although other values of the dopant concentration may be possible in accordance with other embodiments.

In one or more embodiments, the doped region may have a thickness in the range from about 10 nm to about 100 nm, although other values of the thickness may be possible in accordance with other embodiments.

In one or more embodiments, the amorphous or polycrystalline region may be laterally adjacent to the opening.

In one or more embodiments, the amorphous or polycrystalline region may be adjacent to the at least one sidewall of the opening.

In one or more embodiments, configuring at least a portion of the second region as at least one of an amorphous or polycrystalline region may include: implanting amorphization ions into the second region of the semiconductor substrate.

In one or more embodiments, the term "amorphization ions" may include or refer to ions that at least substantially amorphize a crystalline region, in other words, ions that render the crystalline region at least substantially amorphous, in still other words, ions that at least substantially damage or destroy the lattice structure of the crystalline region. In one or more embodiments, the term "amorphization ions" may include or refer to ions that do not have a doping effect on the material of the semiconductor substrate. In one or more embodiments, the term "amorphization ions" may include or refer to ions that are not incorporated into the lattice structure of the material of the semiconductor substrate. In one or more embodiments, the term "amorphization ions" may include or refer to ions that are electrically inactive in the band structure of the material of the semiconductor substrate.

In accordance with various embodiments, implanting the dopant atoms and implanting the amorphization ions are different implantation steps.

In one or more embodiments, the amorphization ions may be implanted into the second region after the dopant atoms are implanted into the at least one sidewall and the bottom of the opening.

In accordance with various embodiments, the amorphization ions are different from the dopant atoms.

In one or more embodiments, the amorphization ions are selected from a group of ions, the group consisting of: argon ions, germanium ions.

In one or more embodiments, the amorphization ions may be implanted with a dose in the range from about $10^{14}$ cm$^{-2}$ to about $10^{16}$ cm$^{-2}$, however other values of the dose may be possible in accordance with other embodiments.

In one or more embodiments, the amorphization ions may be implanted with an energy in the range from about 5 keV to about 500 keV, however other values of the energy may be possible in accordance with other embodiments.

In one or more embodiments, configuring at least a portion of the second region of the semiconductor substrate as at least one of an amorphous or polycrystalline region may include: depositing at least one of an amorphous or polycrystalline layer over a crystalline region of the semiconductor substrate, for example an amorphous silicon layer or a polycrystalline silicon layer (polysilicon layer).

In one or more embodiments, the opening may be configured as a trench.

In one or more embodiments, the trench may be configured to form a shallow trench isolation (STI).

In one or more embodiments, the opening (e.g., trench) may have a depth in the range from about 100 nm to about 10 μm, however other values of the depth may be possible in accordance with other embodiments. In one or more embodiments, the term "depth" may include or refer to a distance between an upper surface of the semiconductor substrate and the bottom of the opening.

In one or more embodiments, the opening (e.g., trench) may have a width in the range from about 100 nm to about 200 μm, however other values of the width may be possible in accordance with other embodiments.

In one or more embodiments, the opening (e.g., trench) may have an aspect ratio (ratio between depth and width) up to about 10, however other values of the aspect ratio may be possible in accordance with other embodiments.

In one or more embodiments, method 100 may further include covering the at least one sidewall and the bottom of the opening with an insulating layer before implanting the dopant atoms into the at least one sidewall and the bottom of the opening, wherein the insulating layer partially fills the opening.

In one or more embodiments, the dopant atoms may be implanted through the insulating layer into the at least one sidewall and the bottom of the opening.

In one or more embodiments, the insulating layer covering the at least one sidewall and the bottom of the opening may serve as a scattering layer to prevent or at least substantially reduce channeling during the implantation of the dopant atoms.

In one or more embodiments, the insulating layer covering the at least one sidewall and the bottom of the opening may include or may be made of an insulating material such as, e.g., an oxide, e.g. silicon oxide, or a nitride, e.g. silicon nitride, or an oxynitride, e.g. silicon oxynitride, or the like.

In one or more embodiments, the insulating layer covering the at least one sidewall and the bottom of the opening may have a thickness in the range from about 2 nm to about 50 nm, however other values of the thickness may be possible in accordance with other embodiments.

In one or more embodiments, method 100 may further include filling the opening with insulating material after implanting the dopant atoms.

In one or more embodiments, the insulating material may include or be an oxide, e.g. silicon oxide, or an oxynitride, e.g. silicon oxynitride, or a nitride, e.g. silicon nitride, or the like.

In one or more embodiments, the insulating material may include or may be the same material as the material of the insulating layer that covers the at least one sidewall and the bottom of the opening.

In one or more embodiments, method 100 may further include covering the second region with an insulating layer, and configuring at least a portion of the second region as at least one of an amorphous or polycrystalline region may include implanting amorphization ions into the second region through the insulating layer.

In one or more embodiments, the insulating layer covering the second region may include or may be made of an insulating material such as, for example, an oxide, e.g. silicon oxide, or a nitride, e.g. silicon nitride, or an oxynitride, e.g. silicon oxynitride, or the like.

In one or more embodiments, the interconnect may be formed over the insulating layer covering the second region of the semiconductor substrate.

In one or more embodiments, implanting the dopant atoms into the at least one sidewall and the bottom of the opening may include disposing a mask over the semiconductor substrate that exposes the first region of the semiconductor substrate and covers the second region of the semiconductor substrate.

In one or more embodiments, the mask may include a suitable mask material, e.g. a hard mask material, such as, e.g. silicon oxide, silicon nitride or silicon oxynitride or the like.

In accordance with various embodiments, the opening and the amorphous or polycrystalline region may both extend from a surface of the semiconductor substrate, e.g. a main processing surface of the semiconductor substrate, into the semiconductor substrate.

In one or more embodiments, the opening may extend deeper into the semiconductor substrate than the amorphous or polycrystalline region.

In one or more embodiments, the amorphous or polycrystalline region may have a depth up to about 1000 nm, however other values of the depth may be possible in accordance with other embodiments.

In one or more embodiments, the semiconductor substrate may include silicon. For example, the semiconductor substrate may be a silicon substrate. However, in accordance with other embodiments, the semiconductor substrate may include or may be made of other semiconductor materials, including compound semiconductor materials.

In one or more embodiments, the semiconductor substrate may be a bulk semiconductor substrate.

In one or more embodiments, the semiconductor substrate may be doped, e.g. p-doped.

In one or more embodiments, a resistivity of the semiconductor substrate may be in the range from about 500 Ω·cm to about 5000 Ω·cm, although other values of the resistivity may be possible in accordance with other embodiments In one or more embodiments, forming the opening in the semiconductor substrate may include etching the semiconductor substrate, for example by means of wet chemical etching or dry etching.

In one or more embodiments, etching the semiconductor substrate may include using a mask that exposes the first region and covers the second region of the semiconductor substrate, wherein implanting the dopant atoms may include using the mask as a doping mask. In other words, one and the same mask may be used for etching the semiconductor substrate and for implanting the dopant atoms.

In one or more embodiments, implanting the dopant atoms into the at least one sidewall and the bottom of the opening may include a tilted implantation. For example, in accordance with an embodiment, an implantation angle may be in the range from about 0° to about 45°, although other values of the implantation angle may be possible in accordance with other embodiments.

In one or more embodiments, the interconnect may be formed over the first region of the semiconductor substrate.

In one or more embodiments, the interconnect may be formed over the second region of the semiconductor substrate.

In one or more embodiments, the interconnect may be formed over the first region and the second region of the semiconductor substrate.

In one or more embodiments, the interconnect may include at least one of a metal and metal alloy, for example copper, aluminum, or an alloy containing at least one of copper and aluminum, although other metals or metal alloys may be possible in accordance with other embodiments.

In one or more embodiments, method 100 may further include forming at least one electrical or electronic device, e.g. a transistor, in the semiconductor substrate, for example in the second region of the semiconductor substrate.

In one or more embodiments, the electrical or electronic device may be laterally electrically insulated (e.g., from another device) by the opening (e.g., shallow trench isolation (STI)).

In one or more embodiments, method 100 may further include coupling the interconnect to the at least one electrical or electronic device, e.g. to a terminal of the transistor.

In one or more embodiments, the semiconductor substrate may be part of a wafer or chip.

In one or more embodiments, method 100 may further include coupling the interconnect to a chip contact pad disposed at a surface of the wafer or chip.

In one or more embodiments, method 100 may include forming a plurality of openings, e.g. trenches, in the semiconductor substrate.

In one or more embodiments, the second region of the semiconductor substrate may be disposed between at least two openings (e.g. trenches) of the plurality of openings (e.g. trenches). For example, the second region may be laterally adjacent to the at least two openings, e.g. adjacent to at least one sidewall of each of the at least two openings.

In one or more embodiments, the second region of the semiconductor substrate may be configured as at least one of an amorphous or polycrystalline region, for example by means of ion implantation or by means of layer deposition, after forming the opening in the semiconductor substrate.

In one or more embodiments, the second region of the semiconductor substrate may be configured as at least one of an amorphous or polycrystalline region, for example by means of ion implantation or by means of layer deposition, after implanting the dopant atoms into the at least one sidewall and the bottom of the opening.

In one or more embodiments, the second region of the semiconductor substrate may be configured as at least one of an amorphous or polycrystalline region, for example by means of ion implantation or by means of layer deposition, before implanting the dopant atoms into the at least one sidewall and the bottom of the opening.

In one or more embodiments, the second region of the semiconductor substrate may be configured as at least one of an amorphous or polycrystalline region, for example by means of ion implantation or by means of layer deposition, before forming the opening in the semiconductor substrate.

In one or more embodiments, method 100 may further include heating the semiconductor substrate including the amorphous or polycrystalline region.

FIG. 2 shows a method 200 for manufacturing a semiconductor device in accordance with various embodiments.

Method 200 may include: forming an opening in a semiconductor substrate, the opening having at least one sidewall and a bottom (in 202); implanting amorphization ions into the semiconductor substrate so as to at least partially amorphize a region adjacent to the at least one sidewall of the opening and a region adjacent to the bottom of the opening (in 204); and forming an interconnect over at least one of the opening and the region adjacent to the at least one sidewall of the opening (in 206).

In one or more embodiments, the region adjacent to the at least one sidewall of the opening and the region adjacent to the bottom of the opening may be completely amorphized by the ion implantation.

In one or more embodiments, the amorphization ions may be selected from a group of ions, the group consisting of: argon ions, germanium ions.

In one or more embodiments, method 200 may further include at least partially filling the opening with insulating material before implanting the amorphization ions into the semiconductor substrate.

In one or more embodiments, the insulating material may cover the at least one sidewall and the bottom of the opening and may partially fill the opening.

In one or more embodiments, the insulating layer may further cover a surface of the region adjacent to the at least one sidewall of the opening.

In one or more embodiments, the interconnect may be formed over the opening.

In one or more embodiments, the interconnect may be formed over the region adjacent to the at least one sidewall of the opening.

In one or more embodiments, the interconnect may be formed over the opening and the region adjacent to the at least one sidewall of the opening.

In one or more embodiments, the interconnect may be formed over the insulating layer covering the surface of the region adjacent to the at least one sidewall of the opening.

Method 200 may further be configured in accordance with one or more embodiments described herein.

FIG. 3 shows a method 300 for manufacturing a semiconductor device in accordance with various embodiments.

Method 300 may include: providing a semiconductor substrate having a first region and a second region laterally adjacent to the first region (in 302); disposing a mask over the semiconductor substrate that exposes the first region and covers the second region (in 304); etching the semiconductor substrate using the mask so as to form a trench in the first region (in 306); implanting dopant atoms into at least one sidewall and a bottom of the trench using the mask so as to form a doped region adjacent to the at least one sidewall and the bottom of the trench (in 308); subsequently removing the mask (in 310); implanting amorphization ions into the second region so as to form an amorphous region laterally adjacent to the trench (in 312); and forming an interconnect over at least one of the trench and the amorphous region (in 314).

In one or more embodiments, the amorphization ions may be selected from a group of ions, the group consisting of: argon ions, germanium ions.

In one or more embodiments, the dopant atoms may be p-type dopant atoms.

In one or more embodiments, the dopant atoms may be selected from a group of dopant atoms, the group consisting of: indium atoms, boron atoms.

In one or more embodiments, method 300 may further include covering the at least one sidewall and the bottom of the trench with a scattering layer, e.g. a scattering oxide, before implanting the dopant atoms.

In one or more embodiments, method 300 may further include filling the trench with insulating material, e.g. an oxide, e.g. silicon oxide, or the like, before implanting the amorphization ions.

In one or more embodiments, the interconnect may be formed over the trench.

In one or more embodiments, the interconnect may be formed over the amorphous region.

In one or more embodiments, the interconnect may be formed over the trench and the amorphous region.

Method 300 may further be configured in accordance with one or more embodiments described herein.

FIGS. 4A to 4J show various processing stages in a method for manufacturing a semiconductor device in accordance with various embodiments.

Figure 4A:
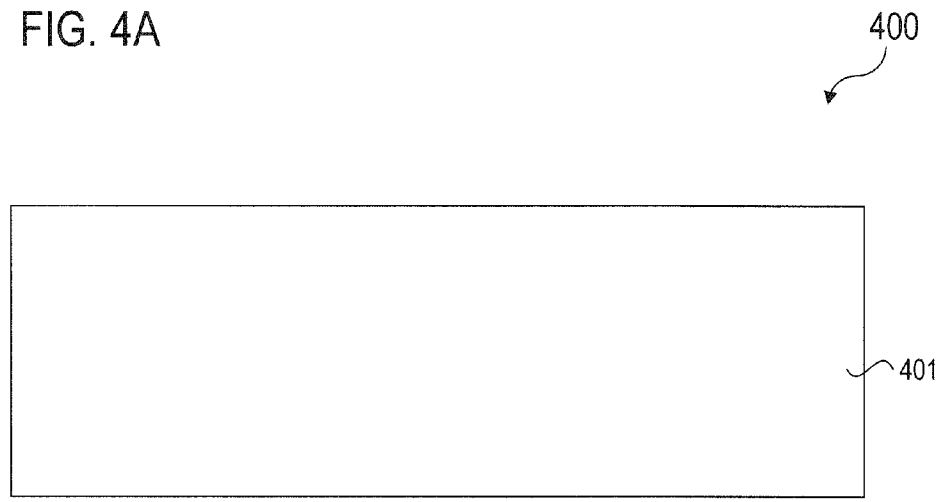

FIG. 4A shows, in cross-sectional view 400, that a semiconductor substrate 401 may be provided. Semiconductor substrate 401 may be a bulk semiconductor substrate, for example a bulk silicon substrate, in accordance with some embodiments.

In accordance with some embodiments, semiconductor substrate 401 may be doped, for example p-doped, for example with a dopant concentration in accordance with one or more embodiments described herein.

Figure 4B:
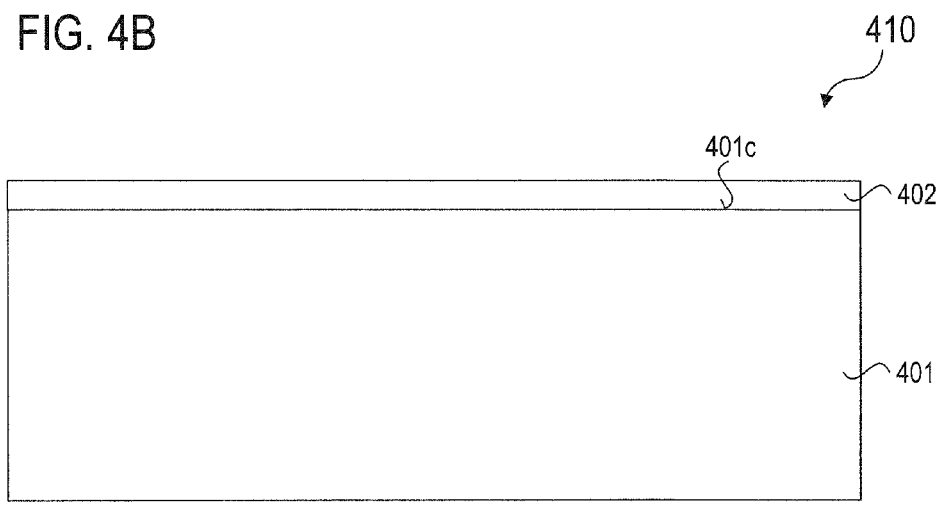

FIG. 4B shows, in cross-sectional view 410, that an insulating layer 402 may be deposited over semiconductor substrate 401 in accordance with some embodiments, for example over an upper surface 401c of semiconductor substrate 401, as shown. Insulating layer 402 may, for example, be an oxide layer, e.g. silicon oxide layer, in accordance with some embodiments. Insulating layer 402 may, for example, have a thickness in the range from about 1 µm to about 20 µm, however other values of the thickness may be possible in accordance with other embodiments.

FIG. 4C shows, in cross-sectional view 420, that a mask 403 may be disposed over semiconductor substrate 401, e.g. over insulating layer 402, as shown. Mask 403 may expose a first region 401a of the substrate while covering a second region 401b of the substrate 401 laterally adjacent to first region 401a, as shown. Mask 403 may, for example, be formed by depositing at least one mask layer and patterning the at least one mask layer. Mask 403 may include or be made of a suitable mask material, for example a hard mask material, in accordance with some embodiments.

FIG. 4D shows, in cross-sectional view 430, that an opening 404 may be formed in first region 401a of semiconductor substrate 401. In accordance with some embodiments, opening 404 may be a trench, and may further be configured as a shallow trench isolation (STI) of the semiconductor device. In one or more embodiments, opening 404 may be formed through etching semiconductor substrate 401 (including insulating layer 402, if present) using mask 403 as an etch mask.

Opening 404 may have at least one sidewall 404a and a bottom 404b, as shown.

Opening 404 may, for example, have a depth measured from an upper surface 401c of semiconductor substrate 401 (denoted as "d1" in FIG. 4D), which may have a value in accordance with one or more embodiments described herein above in connection with FIG. 1, however other values may be possible in accordance with other embodiments. Opening 404 may, for example, have a width (denoted as "w" in FIG. 4D) which may have a value in accordance with one or more embodiments described herein above in connection with FIG. 1, however other values may be possible in accordance with other embodiments. Opening 404 may, for example, have an aspect ratio d1:w which may have a value in accordance with one or more embodiments described herein above in connection with FIG. 1, however other values may be possible in accordance with other embodiments.

It should be noted that a plurality of openings (e.g., trenches) may be formed in semiconductor substrate 401 in accordance with some embodiments, wherein second region 401b of semiconductor substrate 401 may be disposed between two or more openings (e.g., trenches) of the plurality of openings, for example between opening 404 shown in FIG. 4D and at least one additional opening (not shown in FIG. 4D).

Figure 4E:
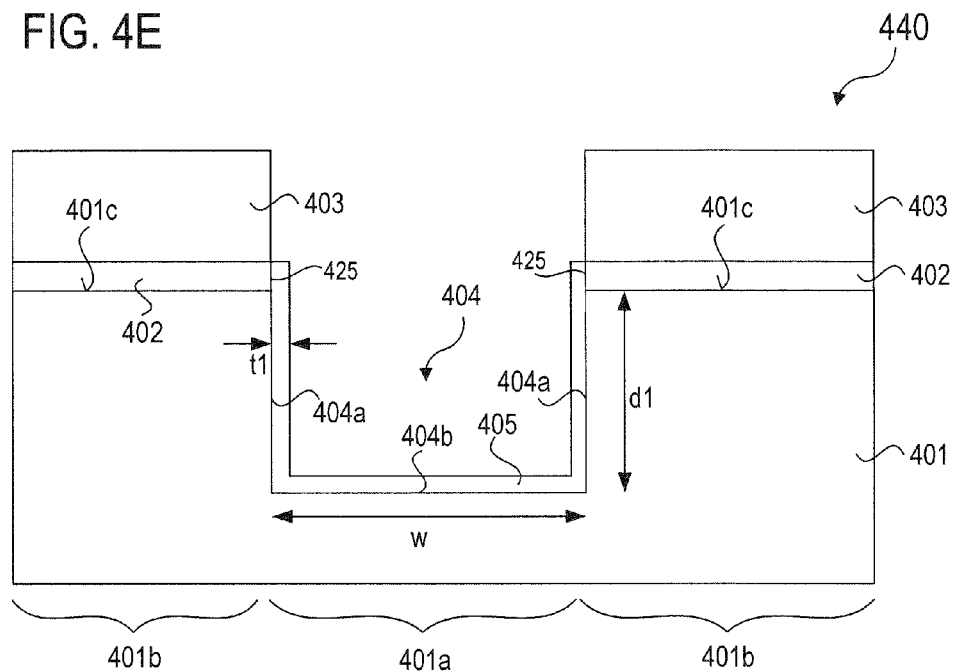

FIG. 4E shows, in cross-sectional view 440, that an insulating layer 405 may be deposited to cover sidewall(s) 404a and bottom 404b of opening 404. In one or more embodiments, insulating layer 405 may further cover sidewalls of insulating layer 402, as shown. Insulating layer 405 may, for example, include or be made of an oxide, e.g. silicon oxide. In one or more embodiments, insulating layer 405 may include or may be made of the same material as insulating layer 402. In this case, an interface, e.g. a grain boundary, 425 between insulating layer 402 and insulating layer 405 may not be discernible in accordance with some embodiments. Insulating layer 405 may, for example, have a thickness (denoted as "t1" in FIG. 4E) in accordance with one or embodiments described herein above in connection with FIG. 1, however other values of the thickness may be possible in accordance with other embodiments. Insulating layer 405 may be configured as a scattering layer, e.g. as a scattering oxide, to prevent or substantially reduce channeling in a subsequent implantation of dopant atoms described herein below.

Figure 4F:
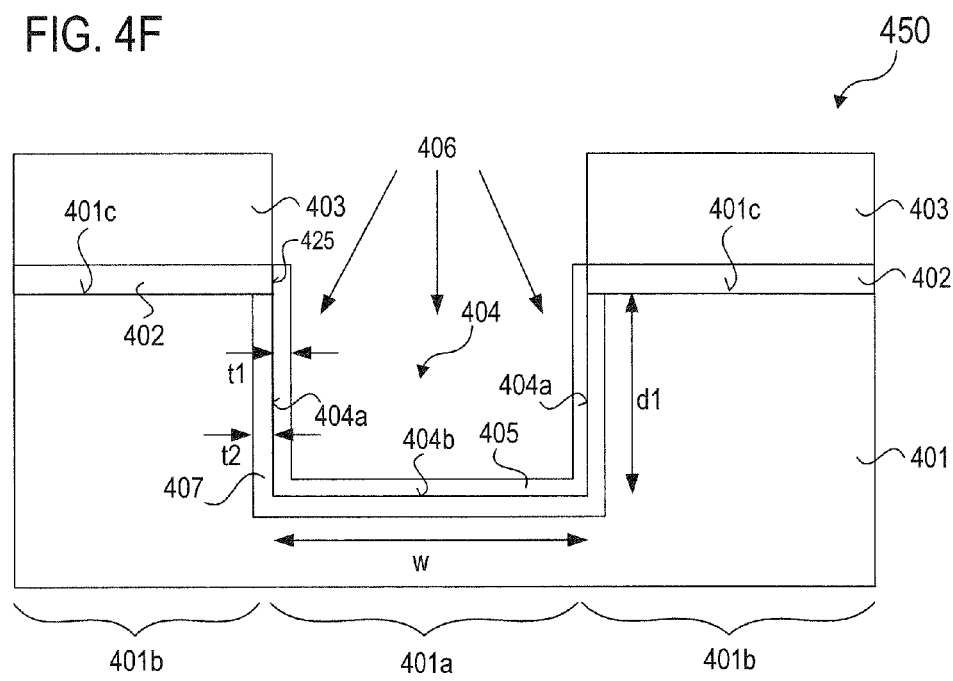

FIG. 4F shows, in cross-sectional view 450, that dopant atoms (represented by arrows 406) may be implanted into sidewall(s) 404a and bottom 404b of opening 404. As shown, dopant atoms 406 may be implanted through insulating layer 405 (e.g., scattering oxide) into sidewall(s) 404a and bottom 404b in accordance with some embodiments.

In accordance with some embodiments, dopant atoms 406 may include or may be p-type dopant atoms such as, for example, indium (In) atoms or boron (B) atoms. In accordance with other embodiments, dopant atoms 406 may include or may be n-type dopant atoms.

In accordance with some embodiments, dopant atoms 406 may be implanted using a tilted implantation. That is, an implantation angle with respect to a surface normal may be non-zero.

An implantation dose and/or energy of the dopant atoms may, for example, be chosen in accordance with one or more embodiments described herein above in connection with FIG. 1, however other values of the dose and/or energy may be possible in accordance with other embodiments.

As shown, a doped region 407 may be formed in semiconductor substrate 401 adjacent to sidewall(s) 404a and bottom 404b of opening 404 by means of the dopant atom 406 implantation. Doped region 407 may have a portion adjacent to sidewall(s) 404a of the opening and a portion adjacent to bottom 404b of opening 404. In one or more embodiments, doped region 407 may surround opening 404 in semiconductor substrate 401, as shown.

Doped region 407 may, for example, be of the same conductivity type as semiconductor substrate 401. For example, in case of a p-type semiconductor substrate 401 (e.g., lightly p-doped substrate), doped region 407 may also be p-doped. In accordance with some embodiments, a dopant concentration of doped region 407 may be higher than a dopant concentration of semiconductor substrate 401. For example, a value of the dopant concentration in doped region 407 may be in accordance with one or more embodiments described herein above in connection with FIG. 1, however other values may be possible in accordance with other embodiments.

Doped region 407 may have a thickness (denoted as "t2" in FIG. 4F), which may for example have a value in accordance with one or more embodiments described herein above in connection with FIG. 1, however other values may be possible in accordance with other embodiments.

Doped region 407 may be configured as a counter doping that may serve to suppress or prevent occurrence of an inversion layer at an interface between opening 404 and semiconductor substrate 401. For example, doped region 407 may be configured as a p-doped region to suppress or prevent occurrence of an n-type inversion layer in semiconductor substrate 401.

As shown in FIG. 4F, in accordance with some embodiments, a first implantation of dopant atoms 406 may illustratively be carried out at a processing stage of the manufacturing process, in which a recess 404 for an STI has been etched into a semiconductor substrate 401 and a mask 403 used for etching has not been removed yet. At this time a p doping may be introduced into the STI trench using a p-type dopant such as, e.g., indium or boron. An implantation angle may be chosen such that both the sidewall(s) 404a and the STI bottom 404b are doped. Mask 403 may prevent an implantation of dopant atoms 406 into areas between different STI trenches (e.g., second region 401b shown in the figure).

FIG. 4G shows, in cross-sectional view 460, that mask 403 may be removed after the implantation of the dopant atoms 406 and opening 403 may be filled with insulating material 408. Insulating material 408 may, for example, include or be an oxide, e.g. silicon oxide, or the like. Insulating material 408 may, for example, include or be the same material as the material(s) of insulating layer 402 and/or insulating layer 405. In case that insulating material 408 is the same material as the material of insulating layer 405, an interface, e.g. a grain boundary, 458 between insulating layer 405 and insulating material 408 may not be discernible in accordance with some embodiments.

In one or more embodiments, an upper surface of filled opening 404 may be flush or substantially flush with an upper surface of insulating layer 402, as shown.

Opening 404 filled with insulating material 408 (and possibly insulating material 405 in accordance with some embodiments) may serve as a shallow trench isolation (STI) of the semiconductor device, in accordance with some embodiments.

FIG. 4H shows, in cross-sectional view 470, that amorphization ions 409 may be implanted into semiconductor substrate 401. In one or more embodiments, amorphization ions 409 may include or may be argon ions. In accordance with other embodiments, other ions may be implanted, such as, e.g., germanium ions.

Amorphization ions 409 may be implanted into second region 401b of semiconductor substrate 401, as shown. In one or more embodiments, amorphization ions 409 may be implanted through insulating layer 402 into second region 401b of semiconductor substrate 401, as shown. In one or more embodiments, amorphization ions 409 may also be implanted into first region 401a including filled opening 404, as shown.

Amorphization ions 409 may, for example, be implanted with a value of the implantation dose and/or implantation energy in accordance with one or more embodiments described herein above in connection with FIG. 1, however other values may be possible in accordance with other embodiments.

Amorphization ions 409 may at least substantially destroy the lattice structure of semiconductor substrate 401 in at least a portion of second region 401b and thereby form an amorphous region 411 in second region 401b of semiconductor substrate 401, as shown. Amorphous region 411 may be laterally adjacent to opening 404, for example adjacent to sidewall(s) 404a of opening 404, as shown.

Amorphous region 411 may have a depth measured from upper surface 401c of semiconductor substrate 401 (denoted as "d2" in FIG. 4H), which may, for example, have a value in accordance with one or more embodiments described herein above in connection with FIG. 1, however other values may be possible in accordance with other embodiments. Depth d2 may, for example, be controlled by the implantation energy of amorphization ions 409.

In one or more embodiments, opening 404 may reach deeper into substrate 401 as amorphous region 411. In other words, depth d1 of opening 404 may be larger than depth d2 of amorphous region 411.

As shown in FIG. 4H, in accordance with some embodiments, a second implantation of amorphization ions 409 (e.g., argon (Ar) implantation) may illustratively be carried out at some stage of the manufacturing process. In accordance with some embodiments, this second implantation may be carried out as late as possible in the process, for example in order to avoid or reduce recrystallization of amorphized region 411 during possible subsequent heat treatments. The crystalline structure of the semiconductor material (e.g., silicon) of the substrate 401 adjacent to the STI trench 404, e.g. between different STI trenches, may be destroyed by means of the amorphization implantation (e.g., argon implantation). In this case, the implantation dose may be chosen such that at the end of the process the semiconductor material (e.g., silicon) in the implanted region (i.e., the amorphous region 411 in FIG. 4H) will be still amorphous at the surface even if one or more heating steps are carried out after the amorphization implantation. In one or more embodiments, the implantation energy may be chosen such that the region at the bottom of the STI trench will not be implanted, as is shown in FIG. 4H, which shows that amorphized region 411 does not reach all the way down to the bottom 404b of opening 404.

FIG. 4I shows, in cross-sectional view 480, another stage of the manufacturing process, for example after one or more heating steps have been applied to semiconductor substrate 401 including amorphous region 411. An amorphous region 411' may be present at the surface of the semiconductor material (e.g., silicon) of substrate 401. Amorphous region 411' may be shallower compared to amorphous region 411 obtained directly after the amorphization ion implantation because a portion of amorphous region 411 may have recrystallized during the one or more heating steps. For example, amorphous region 411' may have a depth measured from upper surface 401c of semiconductor substrate 401 (denoted as "d3" in FIG. 4I) that may be up to about 900 nm, in accordance with some embodiments, however other values of the depth may be possible in accordance with other embodiments.

In amorphous region 411', formation of a surface channel may not be possible due to Fermi level pinning. Furthermore, in opening (e.g., trench) 404, formation of such a surface channel may be prevented by means of doped region 407 (e.g., p doping), which serves as a counter doping.

FIG. 4J shows, in cross-sectional view 490, that an interconnect 412 may be formed over first region 401a of semiconductor substrate 401, including opening 404, and over second region 401b of semiconductor substrate 401, including amorphous region 411'. Interconnect 412 may, for example, include or be made of a conductive material such as a metal or metal alloy, e.g. copper, aluminum, or an alloy containing at least one of copper or aluminum, although other metals and/or metal alloys may be possible in accordance with other embodiments. Interconnect 412 may be coupled to at least one electrical or electronic device, e.g. a transistor, that may be formed in semiconductor substrate 401 (not shown). In accordance with some embodiments, the device, e.g. transistor, may be configured as a high-frequency device, e.g. high-frequency switching transistor, and interconnect 412 may be configured to transmit high-frequency signals to and/or from the high-frequency device. In one or more embodiments, a DC voltage may be applied to interconnect 412. In this case, parasitic capacitances between interconnect 412 and semiconductor substrate 401 may be prevented or substantially reduced by means of doped region 407 and amorphous region 411', which may both suppress or prevent occurrence of an inversion or accumulation layer in semiconductor substrate 401.

In accordance with some embodiments, amorphous region 411' of semiconductor substrate 401 may be formed by means of depositing an amorphous layer, e.g. amorphous silicon layer, over a crystalline region of semiconductor substrate 401, instead of implanting amorphization ions into semiconductor substrate 401. In this case, opening 404 may be formed, for example, after depositing the amorphous layer, for example by means of etching through the amorphous layer and etching partially into the crystalline region of semiconductor substrate 401, in accordance with some embodiments. Alternatively, opening 404 may be formed before depositing the amorphous layer, in accordance with some embodiments.

In accordance with some embodiments, instead of configuring a region or regions adjacent to the opening as an amorphous region (e.g., amorphous region 411' shown in FIG. 4J), the region or regions may be configured as a polycrystalline region, for example by means of depositing a polycrystalline layer, e.g. polysilicon layer, over the crystalline region of semiconductor substrate 401.

Furthermore, in accordance with some embodiments, instead of applying two different implantations, i.e. a dopant implantation to form a doped region around the opening (e.g., trench) and an amorphization implantation to form an amorphous region laterally adjacent to the opening, a single amorphization implantation (e.g., deep argon implantation) may be applied and configured (e.g., by selecting an appropriate implantation dose and/or energy) such that the crystalline structure of the semiconductor substrate may also be destroyed in an area adjacent to the sidewall(s) and bottom of the opening (e.g., trench), e.g. in region 407 shown in FIG. 4J. That is, in accordance with some embodiments, a single amorphization implantation may be used to amorphize a region adjacent to the at least one sidewall of the opening and a region adjacent to the bottom of the opening, as also described herein above in connection with FIG. 2.

FIG. 4J illustratively shows a semiconductor device in accordance with various embodiments.

A semiconductor device in accordance with various embodiments may include: a semiconductor substrate (e.g., substrate 401 in FIG. 4J); an opening disposed in the semiconductor substrate, the opening having at least one sidewall and a bottom (e.g., opening 404 in FIG. 4J); a doped region disposed in the semiconductor substrate adjacent to the at least one sidewall and the bottom of the opening (e.g., doped region 407 in FIG. 4J); at least one of an amorphous or polycrystalline region disposed at a surface of the semiconductor substrate adjacent to the at least one sidewall of the opening (e.g., amorphous region 411' in FIG. 4J); and at least one interconnect disposed over at least one of the opening and the amorphous or polycrystalline region (e.g., interconnect 412 in FIG. 4J).

In one or more embodiments, the opening may be configured as a trench.

In one or more embodiments, the semiconductor substrate may include or be made of silicon.

In one or more embodiments, the semiconductor substrate may be a bulk semiconductor substrate, for example a bulk silicon substrate.

In one or more embodiments, the doped region may be a p-doped region.

In one or more embodiments, a dopant concentration in the doped region may be higher than a dopant concentration of the semiconductor substrate.

In one or more embodiments, the dopant concentration in the doped region may be in the range from about $10^{14}$ cm$^{-3}$ to about $10^{18}$ cm$^{-3}$.

In one or more embodiments, a thickness of the doped region (e.g., thickness t2 in FIG. 4J) may be in the range from about 10 nm to about 100 nm.

In one or more embodiments, a depth of the opening (e.g., depth d1 in FIG. 4J) may be in the range from about 100 nm to about 10 µm.

In one or more embodiments, the opening (e.g., trench) may reach deeper into the substrate than the amorphous or polycrystalline region.

In one or more embodiments, a depth of the amorphous or polycrystalline region (e.g., depth d3 in FIG. 4J) may be up to about 900 nm.

In one or more embodiments, the opening (e.g., trench) may be filled with insulating material (e.g., insulating layer 405 and/or insulating material 408 in FIG. 4J).

In one or more embodiments, the insulating material may include or may be an oxide, e.g. silicon oxide, or a nitride, e.g. silicon nitride, or an oxynitride, e.g. silicon oxynitride, or the like.

In one or more embodiments, the semiconductor device may further include an insulating layer disposed over the semiconductor substrate, e.g. over the second region of the semiconductor substrate (e.g., insulating layer 402 in FIG. 4J).

In one or more embodiments, the insulating layer may include or may be made of an oxide, e.g. silicon oxide, or a nitride, e.g. silicon nitride, or an oxynitride, e.g. silicon oxynitride, or the like.

In one or more embodiments, the semiconductor device may include a plurality of interconnects disposed over the semiconductor substrate, for example over the insulating layer (e.g. interconnect 412 in FIG. 4J).

In one or more embodiments, the interconnect or interconnects may include at least one of a metal and a metal alloy, for example copper, aluminum, or an alloy containing at least one of copper and aluminum.

In one or more embodiments, the trench may be configured as a shallow trench isolation (STI).

In one or more embodiments, the semiconductor device may include at least one electrical or electronic device, e.g. a transistor, disposed in the semiconductor substrate, wherein the at least one interconnect may be coupled to the device.

In one or more embodiments, the electrical or electronic device may be laterally electrically insulated (e.g., from another device) by the opening (e.g., shallow trench isolation (STI)).

In one or more embodiments, the at least one interconnect may be further coupled to a chip contact, e.g. a chip pad.

In one or more embodiments, the semiconductor device may be configured as a high-frequency switch.

The semiconductor device may be further configured in accordance with one or more embodiments described herein.

A semiconductor device in accordance with various embodiments may include: a semiconductor substrate (such as, e.g., substrate 401 in FIG. 4J); an opening disposed in the semiconductor substrate, the opening having at least one sidewall and a bottom (such as, e.g., opening 404 in FIG. 4J), wherein at least one region of the substrate adjacent to the at least one sidewall and the bottom of the opening and at a surface of the substrate adjacent to the opening (such as, e.g., a region including the area of regions 407 and 411' in FIG. 4J) is configured as at least one of an amorphous or polycrystalline region; and an interconnect disposed over at least one of the opening and the amorphous or polycrystalline region (such as, e.g., interconnect 412 in FIG. 4J). The semiconductor device may be further configured in accordance with one or more embodiments described herein.

A semiconductor device in accordance with various embodiments may include: a semiconductor substrate (such as, e.g., substrate 401 in FIG. 4J); an opening disposed in the semiconductor substrate (such as, e.g., opening 404 in FIG. 4J); an amorphous or polycrystalline region surrounding sidewalls and a bottom of the opening and disposed between at least a portion of an upper surface and a crystalline region of the substrate (such as, e.g., a region including the area of regions 407 and 411' in FIG. 4J); an interconnect disposed over at least one of the opening and the amorphous or polycrystalline region (such as, e.g., interconnect 412 in FIG. 4J). The semiconductor device may be further configured in accordance with one or more embodiments described herein.

Various embodiments combine a counter doping in an STI trench with a surface amorphization of one or more regions adjacent to the STI trench in order to suppress or prevent the occurrence of an inversion or accumulation layer in an STI patterned substrate. Thus, for example, parasitic capacitances between metal interconnects and the STI patterned substrate may be reduced or prevented and high-frequency properties (e.g., signal quality) of a semiconductor device (e.g., high-frequency switch) including the STI patterned substrate may be improved. According to other embodiments, also one or more substrate regions adjacent to the bottom and sidewall(s) of the STI trench may be amorphized.

While various aspects of this disclosure have been particularly shown and described with reference to specific embodiments, it should be understood by those skilled in the art that various changes in form and detail may be made therein without departing from the spirit and scope of the disclosure as defined by the appended claims. The scope of the disclosure is thus indicated by the appended claims and all changes which come within the meaning and range of equivalency of the claims are therefore intended to be embraced.

What is claimed is:

1. A method for manufacturing a semiconductor device, comprising:
   forming an opening in a first region of a semiconductor substrate, the opening having at least one sidewall and a bottom;
   forming a counter-doping region, comprising implanting dopant atoms into the at least one sidewall and the bottom of the opening, the counter-doping region having a same conductivity type as the semiconductor substrate;
   configuring at least a portion of a second region of the semiconductor substrate laterally adjacent to the first region as at least one of an amorphous or polycrystalline semiconductor region;
   covering the second region with a second region insulating layer; and forming an interconnect over the first and second regions of the semiconductor substrate, wherein the interconnect spans across the opening of the semiconductor substrate in the first region and the interconnect is formed over the second region insulating layer in the second region;
wherein the semiconductor device is a high-frequency device.

2. The method of claim 1, wherein configuring at least a portion of the second region of the semiconductor substrate as at least one of an amorphous or polycrystalline semiconductor region comprises:
implanting amorphization ions into the second region of the semiconductor substrate.

3. The method of claim 2, wherein the amorphization ions are implanted into the second region after the dopant atoms are implanted into the at least one sidewall and the bottom of the opening.

4. The method of claim 2, wherein the amorphization ions are selected from a group of ions, the group consisting of: argon ions, germanium ions.

5. The method of claim 2, wherein the amorphization ions are implanted with an implantation dose of about $10^{14}$ cm$^{-2}$ to about $10^{16}$ cm$^{-2}$.

6. The method of claim 2, wherein the amorphization ions are implanted with an implantation energy of about 5 keV to about 500 keV.

7. The method of claim 1, wherein configuring at least a portion of the second region of the semiconductor substrate as at least one of an amorphous or polycrystalline semiconductor region comprises:
depositing at least one of an amorphous or polycrystalline layer over a crystalline region of the semiconductor substrate.

8. The method of claim 1, wherein the dopant atoms are p-type dopant atoms.

9. The method of claim 1, wherein the dopant atoms are selected from a group of dopant atoms, the group consisting of: indium atoms, boron atoms.

10. The method of claim 1, wherein the opening is configured as a trench.

11. The method of claim 1, further comprising covering the at least one sidewall and the bottom of the opening with a first region insulating layer before implanting the dopant atoms into the at least one sidewall and the bottom of the opening, wherein the first region insulating layer partially fills the opening.

12. The method of claim 1, further comprising filling the opening with insulating material after implanting the dopant atoms.

13. The method of claim 12, further comprising implanting amorphization ions into the filled opening.

14. The method of claim 1, wherein configuring at least a portion of the second region as at least one of an amorphous or polycrystalline semiconductor region comprises implanting amorphization ions into the second region through the second region insulating layer.

15. The method of claim 14, wherein the amorphous or polycrystalline semiconductor region is formed under the insulating layer.

16. The method of claim 1, wherein implanting the dopant atoms into the at least one sidewall and the bottom of the opening comprises disposing a mask over the semiconductor substrate that exposes the first region of the semiconductor substrate and covers the second region of the semiconductor substrate.

17. The method of claim 1, wherein the opening reaches deeper into the semiconductor substrate than the amorphous or polycrystalline semiconductor region.

18. The method of claim 1, wherein forming the opening in the semiconductor substrate comprises etching the semiconductor substrate.

19. The method of claim 1, wherein etching the semiconductor substrate comprises using a mask that exposes the first region and covers the second region of the semiconductor substrate, and wherein implanting the dopant atoms comprises using the mask as a doping mask.

20. The method of claim 1, wherein implanting the dopant atoms into the at least one sidewall and the bottom of the opening comprises a tilted implantation.

21. The method of claim 1, wherein the high-frequency device is a high-frequency switch comprising one or more transistors.

22. The method of claim 1, wherein the at least portion of a second region of the semiconductor substrate laterally adjacent to the first region that is configured as at least one of an amorphous or polycrystalline semiconductor laterally surrounds the opening.

23. A method for manufacturing a semiconductor device, comprising:
forming an opening in a semiconductor substrate, the opening having at least one sidewall and a bottom;
covering the at least one sidewall and the bottom of the opening with a first region insulating layer, wherein the first region insulating layer partially fills the opening;
after covering the opening with the first region insulating layer, implanting amorphization ions into the semiconductor substrate so as to amorphize a semiconductor region adjacent to the at least one sidewall of the opening and a region adjacent to the bottom of the opening;
covering the region adjacent to the at least one sidewall of the opening with a second region insulating layer; and
forming an interconnect over the opening and the region adjacent to the at least one sidewall of the opening, wherein the interconnect spans across the opening of the semiconductor substrate and the interconnect is formed over the second region insulating layer;
wherein the semiconductor device is a high-frequency device.

24. The method of claim 23, wherein the amorphization ions are selected from a group of ions, the group consisting of: argon ions, germanium ions.

25. A semiconductor device, comprising:
a semiconductor substrate;
an opening disposed in the semiconductor substrate, the opening having at least one sidewall and a bottom;
a doped region disposed in the semiconductor substrate adjacent to the at least one sidewall and the bottom of the opening, the doped region having a same conductivity type as the semiconductor substrate;
at least one of an amorphous or polycrystalline semiconductor region disposed at a surface of the semiconductor substrate adjacent to the at least one sidewall of the opening;
an insulating layer disposed over the amorphous or polycrystalline semiconductor region; and
an interconnect disposed over the opening and the amorphous or polycrystalline region,
wherein the interconnect spans across the opening of the semiconductor substrate, wherein the insulating layer is disposed between the interconnect and the amorphous or crystalline semiconductor region, and wherein the semiconductor device is a high-frequency device.

\* \* \* \* \*